United States Patent
Kang et al.

(10) Patent No.: US 8,338,714 B2
(45) Date of Patent: Dec. 25, 2012

(54) HEAT-RADIATING SUBSTRATE AND MANUFACTURING METHOD THEREOF

(75) Inventors: Jung Eun Kang, Gyunggi-do (KR); Hye Sook Shin, Gyunggi-do (KR); Ki Ho Seo, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 190 days.

(21) Appl. No.: 12/852,323

(22) Filed: Aug. 6, 2010

(65) Prior Publication Data

US 2011/0240346 A1 Oct. 6, 2011

(30) Foreign Application Priority Data

Mar. 31, 2010 (KR) .................. 10-2010-0029474

(51) Int. Cl.
*H05K 1/00* (2006.01)

(52) U.S. Cl. .......... 174/252; 174/255; 174/262; 29/831; 216/56

(58) Field of Classification Search .................. 174/257, 174/261, 262, 265, 266, 252, 250, 255; 29/830, 29/831, 846, 852; 216/17, 18, 53, 56
See application file for complete search history.

(56) References Cited

U.S. PATENT DOCUMENTS

| 6,734,375 B2 * | 5/2004 | Kawakita et al. ............. 174/264 |
| 7,662,218 B2 * | 2/2010 | Maeda et al. ..................... 96/4 |
| 2003/0001150 A1 * | 1/2003 | Iwasaki et al. ..................... 257/3 |
| 2006/0231525 A1 * | 10/2006 | Asakawa et al. ................ 216/56 |
| 2007/0228568 A1 * | 10/2007 | Oku et al. ...................... 257/741 |
| 2009/0255714 A1 * | 10/2009 | Sohn et al. ..................... 174/250 |
| 2010/0155952 A1 * | 6/2010 | Koike et al. .................... 257/751 |

FOREIGN PATENT DOCUMENTS

| JP | 61-125153 | 6/1986 |
| JP | 63-58706 | 8/1986 |
| JP | 63-005548 | 1/1988 |
| JP | 05-198252 | 8/1993 |
| JP | 09-266374 | 10/1997 |
| JP | 2004-179291 | 6/2004 |
| WO | 2007/007830 | 1/2007 |

OTHER PUBLICATIONS

Office Action from counterpart Japanese Patent Application No. 2010-179240, mailed May 8, 2012, 2 pages and 1 page English summary.

* cited by examiner

*Primary Examiner* — Hoa C Nguyen
(74) *Attorney, Agent, or Firm* — Blakely Sokoloff Taylor & Zafman LLP

(57) ABSTRACT

Disclosed herein is a heat-radiating substrate. The heat-radiating substrate includes: a metal core layer; a first insulating layer that is formed on one side or both sides of the metal core layer, includes a bather layer contacting with the metal core layer, first and second pores having different diameters, and a porous layer connected with the bather layer; a first circuit layer that is embedded in the first insulating layer, filled in the second pores of the porous layer, and connected to the sides of the second pores; and a second insulating layer that is formed on the porous layer of the first insulating layer. Further, in the heat-radiating substrate of the present embodiment, the first circuit layer is partially filled in the second pores and the second insulating layer is filled in the second pores to make a plane the first insulating layer. In addition, disclosed is a method of manufacturing the heat-radiating substrate.

19 Claims, 13 Drawing Sheets

HEAT-RADIATING SUBSTRATE AND MANUFACTURING METHOD THEREOF

CROSS REFERENCE TO RELATED APPLICATION

This application claims the benefit of Korean Patent Application No. 10-2010-0029474, filed on Mar. 31, 2010, entitled "Heat-Radiating Substrate and Manufacturing Method Thereof", which is hereby incorporated by reference in its entirety into this application.

BACKGROUND OF THE INVENTION

1. Technical Field

The present invention relates to a heat-radiating substrate and a manufacturing method thereof.

2. Description of the Related Art

Recently, efforts for manufacturing various types of heat-radiating substrates using metal having good thermal conductivity has been made to remove problems in heat radiation of power elements and power modules that are applied in a variety of fields. Further, heat-radiating substrates with a multilayer micro pattern have been required for other products as well as LED modules and power modules.

However, for organic PCBs, ceramic substrates, glass substrates, or heat-radiating substrates including a metal core layer in the prior art, it is relatively difficult to form a micro pattern and the cost is high, as compared with silicon wafers, such that the application field has been limited.

For example, according to a method of manufacturing a printed circuit board of the prior art, a copper clad laminate (CCL) having a copper foil on a pre-preg is prepared first. Next, a vertical via-hole is formed by a mechanical drill bit to connect the layers and then an electroless plated layer is formed on the copper clad, including the inner wall of the vertical via-hole.

Thereafter, an electrolytic plated layer is formed on the electroless plated layer, including the inside of the vertical via-hole, by the electrolytic copper plating (fill plating). A circuit layer including a via is formed by patterning the copper foil, the electroless plated layer, and the electrodeposited layer.

Meanwhile, a heat-radiating substrate including a metal core layer is formed by using a metal core layer instead of the copper clad laminate.

Thereafter, a multilayer printed circuit board is manufactured by forming a build-up layer on the circuit layer. The build-up layer is formed by sequentially stacking circuit patterns formed by plating and printing, and insulating materials.

The printed circuit board (or heat-radiating substrate) of the prior art which was formed by the above method according to the prior art had a problem that it is hard to form a micro pattern and heat-radiating properties are deteriorated. Further, the multilayer printed circuit board (or multilayer heat-radiating substrate) of the prior art had a problem that the thickness of the printed circuit board was increased by the thickness of the build-up layer. Therefore, there was a problem that it takes a long time for the multilayer printed circuit board to process signals due to the large length of the wire, and as a result, it negates the requirement of high-integrated wiring.

SUMMARY OF THE INVENTION

The present invention has been made in an effort to provide a heat-radiating substrate that has improved heat-radiating performance by including a porous oxidized-insulating layer and can be provided with a micro pattern by including a circuit layer embedded in the oxidized-insulating layer.

Another object of the present invention is to provide a multilayer heat-radiating substrate having a slim structure with a multilayer structure, without using a build-up method.

Still another object of the present invention is to provide a method of manufacturing the heat-radiating substrate and the multilayer heat-radiating substrate.

A heat-radiating substrate according to an exemplary embodiment of the present invention includes: a metal core layer; a first insulating layer that is formed on one side or both sides of the metal core layer, includes a barrier layer contacting with the metal core layer, first and second pores having different diameters, and a porous layer connected with the barrier layer; a first circuit layer that is embedded in the first insulating layer, filled in the second pores of the porous layer, and connected to the sides of the second pores; and a second insulating layer that is formed on the porous layer of the first insulating layer.

Further, the heat-radiating substrate further includes: a second circuit layer formed on the second insulating layer; and a first via connecting the first circuit layer with the second circuit layer.

Further, the present invention further includes a second via connecting the second circuit layers formed on both sides of the metal core layer.

Further, the metal core layer of the present invention is made of aluminum and the first insulating layer is made of $Al_2O_3$.

Further, a heat-radiating substrate according to an exemplary embodiment of the present invention includes: a metal core layer; a first insulating layer that is formed on one side or both sides of the metal core layer, includes a barrier layer contacting with the metal core layer, first and second pores having different diameters, and a porous layer connected with the barrier layer; a first circuit layer that is embedded in the first insulating layer, partially filled in the second pores of the porous layer from the bottom of the second pores, and connected to the sides of the second pores; and a second insulating layer that is filled from the upper ends of the second pore in the thickness direction to make a plane having a flush surface with the first insulating layer.

Further, the second insulating layer of the present invention further includes: a second circuit layer that is filled in the first pores and the second pores of the porous layer to make a plane having a flush surface with the first insulating layer and formed on the flat surface made by the first insulating layer and the second insulating layer; and a first via that connects the first circuit layer with the second circuit layer.

Further, the second insulating layer of the present invention is filled in the first pores and the second pores of the porous layer, covering the upper surface of the porous layer of the first insulating layer.

Further, the heat-radiating substrate of the present invention further includes: a second circuit layer formed on the second insulating layer; and a first via connecting the first circuit layer with the second circuit layer.

Further, the present invention further includes a second via connecting the second circuit layers formed on both sides of the metal core layer.

Further, the metal core of the present invention is made of aluminum and the first insulating layer is made of $Al_2O_3$.

A method of manufacturing a heat-radiating substrate according to an exemplary embodiment of the present invention includes: providing a metal core member; forming a first insulating layer, which includes a barrier layer contacting with the metal core member and a porous layer including first pores connected with the bather layer and having a larger diameter at the center portion than both ends, while anodizing one side or both sides of the metal core member; performing isotropic-etching such that the first pores included in the porous layer becomes second pores connected with a plurality of adjacent pores, at the sides; forming a first circuit layer that is embedded in the second pores; and sealing the porous member with a second insulating layer.

Further, the present invention further includes: forming a first via-hole to expose the first circuit layer; and forming a second circuit layer disposed on the first via connected with the first circuit layer and the second insulating layer, after the sealing with the second insulating layer.

Further, the present invention further includes: forming a second via-hole through the heat-radiating substrate; forming an inner insulating layer on the inner wall of the second via-hole; and forming a first via connected with the first circuit layer, a second circuit layer disposed on the second insulating layer, and a second via connecting the second circuit layers disposed on both sides of the metal core member.

Further, the metal core member of the present invention is made of aluminum and the first insulating layer is made of $Al_2O_3$.

Further, a method of manufacturing a heat-radiating substrate according to an exemplary embodiment of the present invention includes: providing a metal core member; forming a first insulating layer, which includes a barrier layer contacting with the metal core member and a porous layer including first pores connected with the barrier layer and having a larger diameter at the center portion than both ends, while anodizing one side or both sides of the metal core member; performing isotropic-etching such that the first pores included in the porous layer becomes second pores connected with a plurality of adjacent pores, at the center portions; partially filling a first circuit layer from the bottom of the second pores in the second pores to be embedded in the second pore; and filling a second insulating layer from the upper ends of the second pores in the thickness direction to make a plane having a flush surface with the first insulating layer.

Further, in the forming of the second insulating layer of the present invention, the second insulating layer is filled in the first pores and the second pores of the porous layer to cover the upper surface of the first insulating layer.

Further, the present invention further includes: forming a first via-hole to expose the first circuit layer; and forming a second circuit layer disposed on the first via connected with the first circuit layer and the second insulating layer, after the forming of the second insulating layer.

Further, the present invention further includes: forming a second via-hole through the heat-radiating substrate; forming an inner insulating layer on the inner wall of the second via-hole; and forming the first via connected with the first circuit layer, the second circuit layer disposed on the second insulating layer, and a second via connecting the second circuit layers disposed on both sides of the metal core member.

Further, the metal core member of the present invention is made of aluminum and the first insulating layer is made of $Al_2O_3$.

DESCRIPTION OF THE PREFERRED EMBODIMENTS

Figure 1:
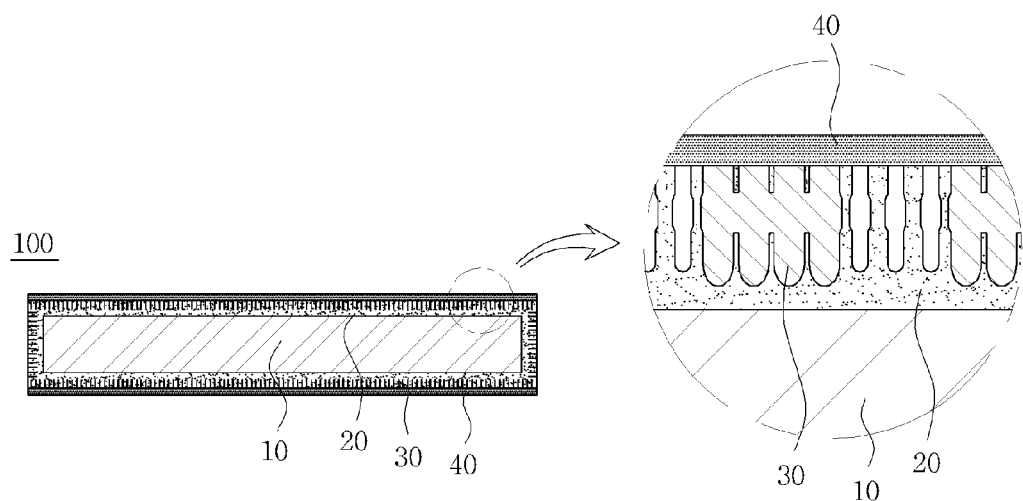
FIG. 1 is a cross-sectional view schematically showing a heat-radiating substrate according to a first preferred embodiment of the present invention.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, in describing the present invention, a detailed description of related known functions or configurations will be omitted so as not to obscure the subject of the present invention.

Figure 2:
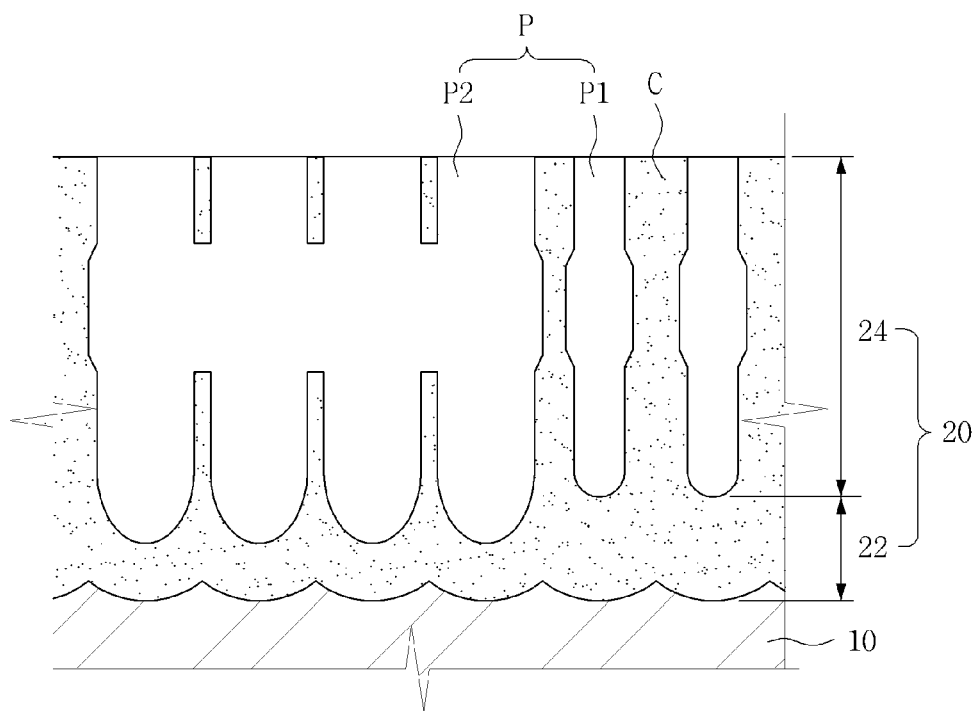
FIG. 2 is an enlarged cross-sectional view showing the structure of a first insulating layer included in the heat-radiating substrate shown in FIG. 1.
Figure 3:
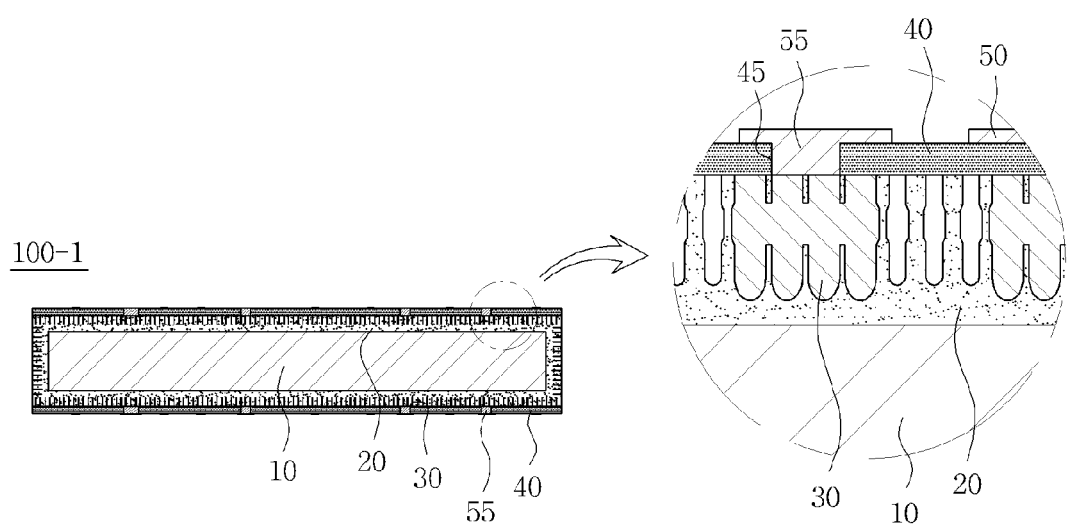
FIG. 3 is a cross-sectional view showing a modified embodiment of the heat-radiating substrate shown in FIG. 1.
Figure 4:
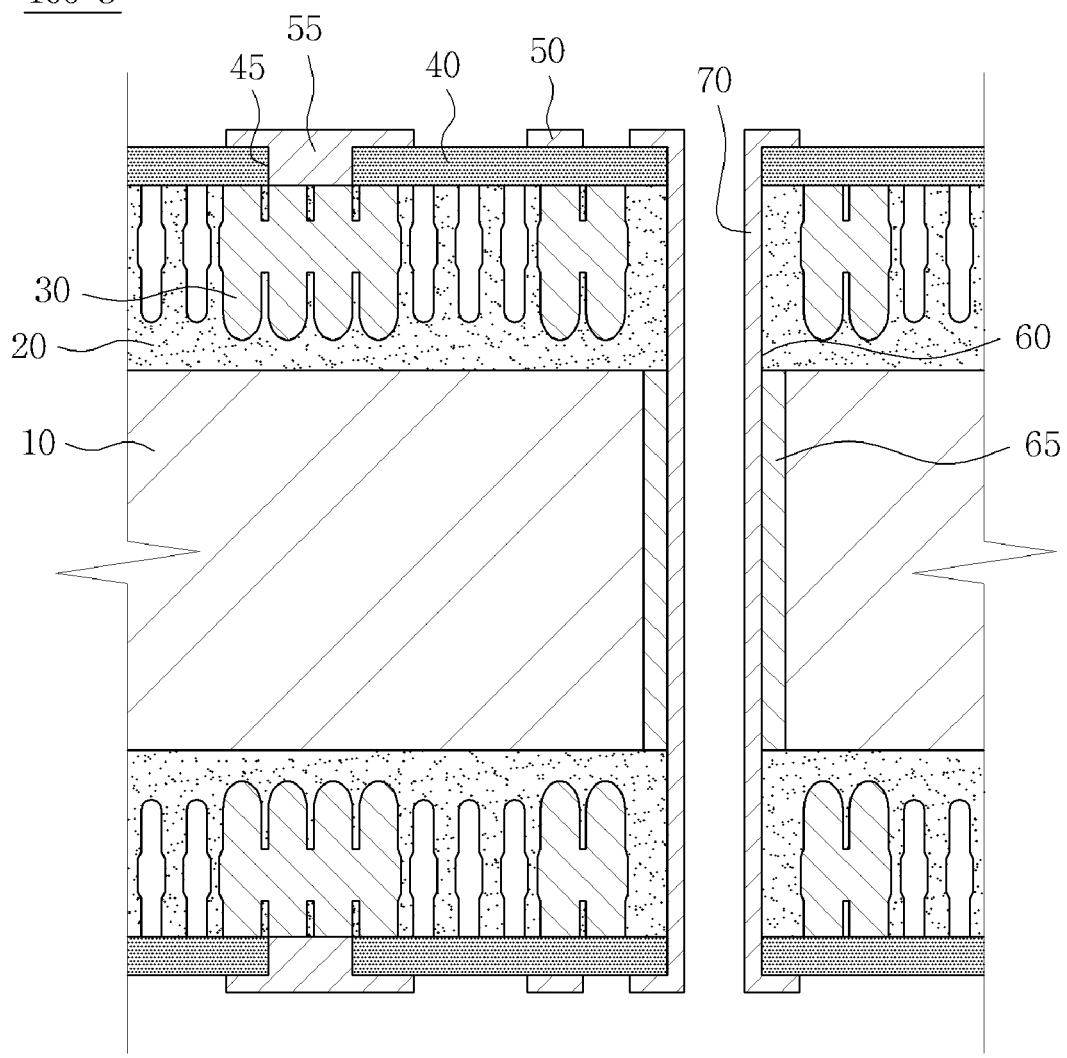
FIG. 4 is a cross-sectional view showing a modified embodiment of the heat-radiating substrate shown in FIG. 3.

FIG. 1 is a cross-sectional view schematically showing a heat-radiating substrate according to a first preferred embodiment of the present invention, FIG. 2 is an enlarged cross-sectional view showing the structure of a first insulating layer included in the heat-radiating substrate shown in FIG. 1, FIG. 3 is a cross-sectional view showing a modified embodiment of the heat-radiating substrate shown in FIG. 1, and FIG. 4 is a cross-sectional view showing a modified embodiment of the heat-radiating substrate shown in FIG. 3.

A heat-radiating substrate according to this embodiment is described hereafter with reference to the figures.

As shown in FIG. 1, a heat-radiating substrate 100 according to this embodiment includes a metal core layer 10, a first insulating layer 20 formed on one or both sides of the metal core layer 10, a first circuit layer 30 embedded in the first insulating layer 20, and a second insulating layer 40.

The metal layer 10 is made of metal and has larger strength than common resin layers, such that it has large resistance against warpage and disperses and discharges heat generated from heating elements (not shown) mounted on the substrate to the outside.

The metal core layer 10, for example, may be made of aluminum (Al), nickel (Ni), magnesium (Mg), titanium (Ti), zinc (Zn), tantalum (Ta), or alloys of them. Aluminum, however, is exemplified for the convenience of description.

The first insulating layer 20 is formed on the metal core layer 10 and includes a barrier layer 22 contacting the metal core layer 10 and a porous layer 24 connected to the bather layer. The first insulating layer 20 is described in detail with reference to FIG. 2.

The first insulating layer 20 shown in FIG. 2 is an oxidized-insulating layer formed by anodizing the metal core layer 10, in which the first insulating layer 20 having the metal core layer 10 made of aluminum is made of alumina ($Al_2O_3$).

The barrier layer 22 is an oxidized-insulating layer forming an interface with the metal core layer 10 in contact with the metal core layer 10 and the porous layer 24 is a porous layer connected with the barrier layer 22 and having crystalline pillars C and pores P.

In this configuration, the porous layer 24 includes pores P classified into two types. One type of the pores is a pore P1 (hereafter, first pore) having a shape that is larger in diameter at the center portion than both ends and most of the pores P are the first pores. The first pore P1 is spatially separated from another adjacent first pore P1.

The other type is a second a pore P2 (hereafter, second pore) having a shape connected with an adjacent pore, at the side, and embedding the first circuit layer 30. The second pore P2, similar to the first pore P1, is larger in diameter at the center portion than both ends and has a slightly larger diameter than the first pore P1. This is because the second pore P2 is formed by performing isotropic etching to some of the first pores P1 in order to be connected with adjacent pores, at the sides. The sides at the center portion, which is larger in diameter than at both ends, of adjacent pores P2 are connected in the isotropic etching.

Meanwhile, the shapes of the first pore P1 and the second pore P2 are based on the manufacturing process of the heat-radiating substrate 100, which will be made clear in describing the method of manufacturing the heat-radiating substrate.

Further, the first circuit layer 30 is, as shown in FIG. 1, embedded in the first insulating layer 20. Unlike that a circuit layer is formed on an insulating layer in common heat-radiating substrates (or printed circuit boards), the first circuit layer 30 of the heat-radiating substrate 100 according to this embodiment is embedded in the insulating layer, such that the thickness of the heat-radiating substrate can be reduced and damage to the circuit layer can be prevented.

To be specific, the first circuit layer 30 is formed in the second pores P2 of the porous layer 24. Since the second pores P2 are connected with adjacent other pores P, at the sides (sides of the center portion), as described above, the first circuit layer 30 embedded in the second pores P2 has the same shape as the second pores P2 and connected with the circuit pattern formed in the adjacent second pores P2, at the sides.

Further, the first circuit layer 30 is formed by plating, it is filled from the bottom along the sides in the second pores P2. In this configuration, it is preferable that the first circuit layer 30 is formed higher than the center from the bottom of the second pores P2 to be connected at the sides.

Further, it is more preferable that, as shown in FIG. 1, the first circuit layer 30 is fully filled in the second pores P2 to have the same height as the crystalline pillars C. The first circuit layer 30 having this shape is sufficiently connected with the circuit pattern filled in the adjacent second pores p2 and allows the second layer 40 (described below) to be formed flat and firmly bonded.

The second insulating layer 40 is formed on the porous layer 24 of the first insulating layer 20. The second insulating layer 40 is bonded to the upper ends of the crystalline pillars C, covering the upper ends of the first pores P1 and the second pores P2. Further, as described above, when the first circuit layer 30 has the same height as the crystalline pillars C, the second insulating layer 40 is also in contact with the upper surface of the first circuit layer 30. The second insulating layer 40 makes the outer surface of the heat-radiating substrate 100 flat and protects the first circuit layer 30 exposed to the outside from oxidation.

On the other hand, in a multilayer heat-radiating substrate, although the second insulating layer 40 may be made of an insulating material, such as a pre-preg used in a common build-up type, as shown in FIG. 1, when a single circuit layer is formed, the second insulating layer 40 has the feature of a protective layer, such that a solder resist can be used for the second insulating layer 40.

Meanwhile, though not shown in FIG. 1, a pad may be formed by forming an opening through the second insulating layer 40 such that the first circuit layer 30 is exposed to the outside. The pad is connected with an electronic element disposed outside.

FIG. 3 shows a cross section of a multilayer heat-radiating substrate, which is a modified embodiment of the heat-radiating substrate shown in FIG. 1. The multilayer heat-radiating substrate is described hereafter with reference to the figure. However, the detailed description for the same configuration as that described with reference to FIGS. 1 and 2 is not provided.

As shown in FIG. 3, a heat-radiating substrate 100-1 according to this embodiment forms a two-layered multilayer substrate, by further including a second circuit layer 50 formed on a second insulating layer 40 and a first via 55 connecting a first circuit layer 30 with a second circuit layer.

The second circuit layer 50 is formed on the second insulating layer 40 by plating, in which copper, silver, and nickel may be used.

The first via 55 is formed above a via-hole 45 (hereafter, first via-hole) formed through the second insulating layer 40 to connect the first circuit layer 30 with the second circuit layer 50. As shown in FIG. 3, when the first circuit layer 30 has the same height as the crystalline pillars C, the first via 55 is also in contact with the upper surface of the first circuit layer 30. The first via 55 may be simultaneously formed with the second circuit layer 50 by plating, and the detailed description of the manufacturing method is provided below.

FIG. 4 shows a cross section of a double-sided heat-radiating substrate, which is a modified embodiment of the heat-radiating substrate shown in FIG. 3. The double-sided heat-radiating substrate is described hereafter with reference to the figure. However, the detailed description for the same configuration as that described with reference to FIGS. 1 to 3 is not provided.

A heat-radiating substrate 100-2 according to this embodiment, as shown in FIG. 4, forms a double-sided heat-radiating substrate, by further including a second via 70 connecting second circuit layers 50 formed on both sides of a metal core layer 10.

In the heat-radiating substrate 100-2, a first insulating layer 20, a first circuit layer 30 embedded in the first insulating layer 20, a second insulating layer 40, a second circuit layer 50 formed on the second insulating layer 40, and a first via 55 connecting the first circuit layer 30 with the second circuit layer are formed on both sides of the metal core layer 10.

The second via 70 connecting the second circuit layers 50 formed on both sides of the metal core layer 10 is a plated pattern formed on the inner wall of a second via-hole 60 formed through the heat-radiating substrate.

An inner insulating layer 65 is formed between the second via 70 and the inner wall of the second via-hole 60 to prevent a short between the second via 70 and the metal core layer 10. Therefore, the second via 70 substantially becomes a plated pattern formed on the inner insulating layer 65 formed on the inner wall of the second via-hole 60.

The inner insulating layer 65, as shown in FIG. 4, may be formed by forming an inner oxidized-insulating layer (e.g. alumina inner layer) by oxidizing the portion passing through the metal core layer 10 of the inner wall of the second via-hole 60, or by applying a thin layer of an insulating material throughout the inner wall of the second via-hole 60.

Figure 5:
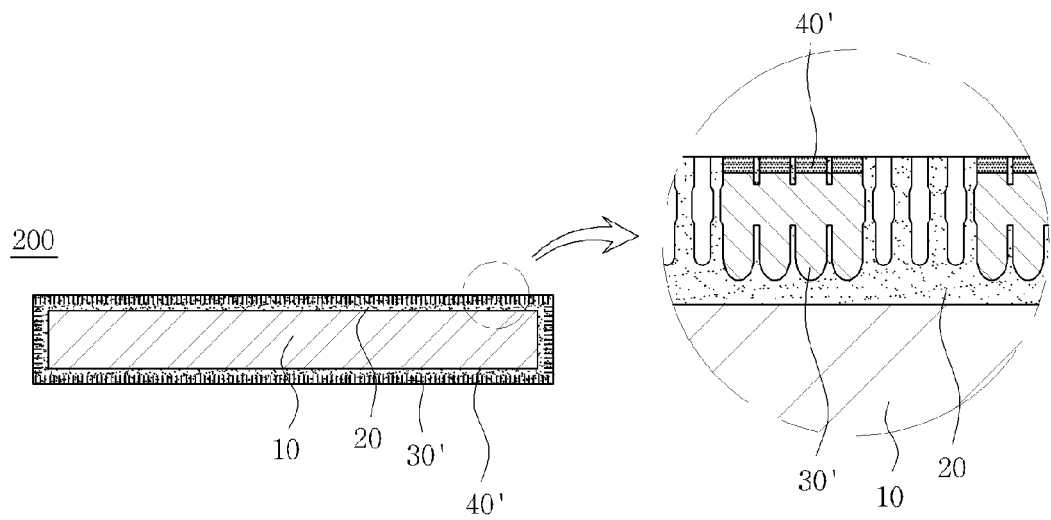
FIG. 5 is a cross-sectional view showing a heat-radiating substrate according to a second preferred embodiment of the present invention.
Figure 6:
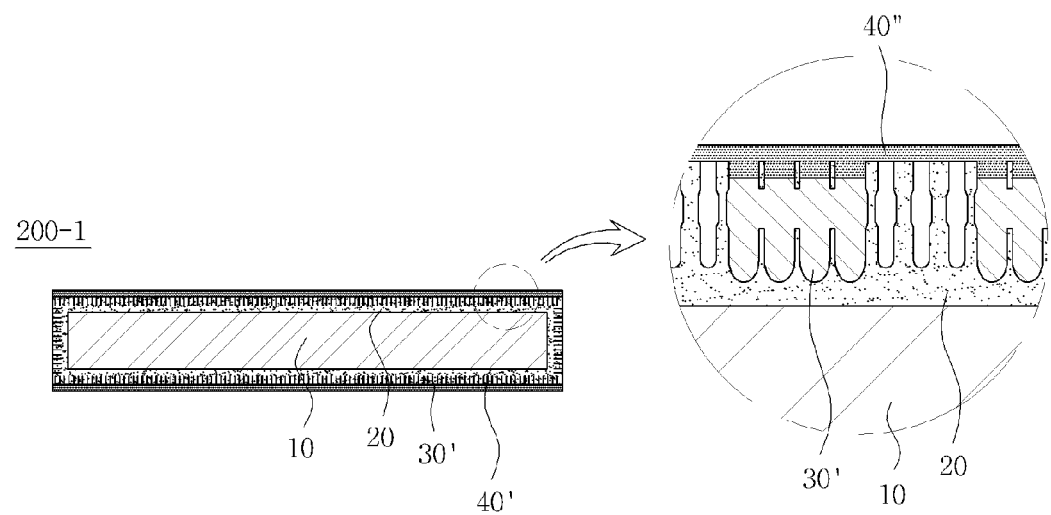
FIGS. 6 and 7 are cross-sectional views showing modified embodiments of the heat-radiating substrate shown in FIG. 5.
Figure 7:
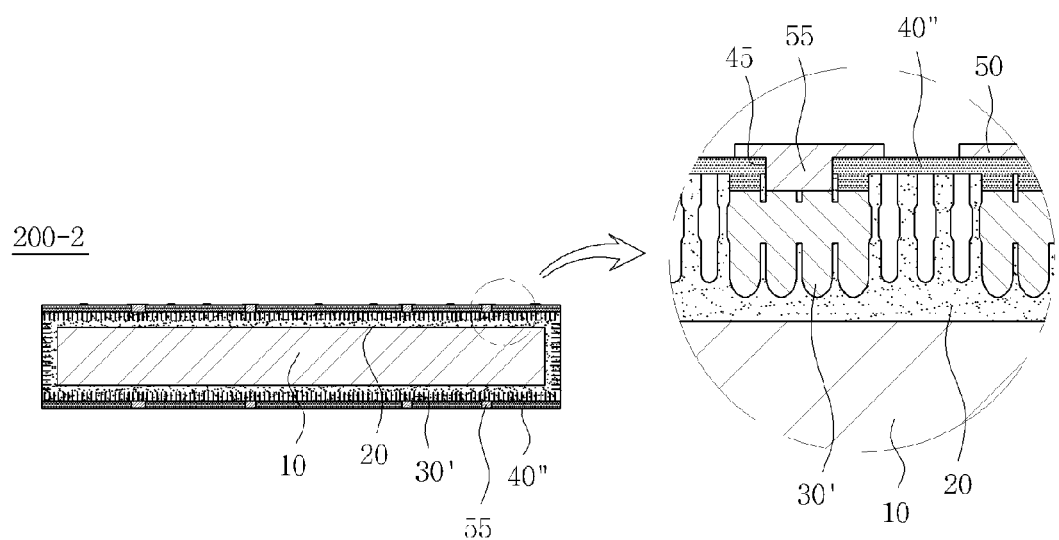
Figure 8:
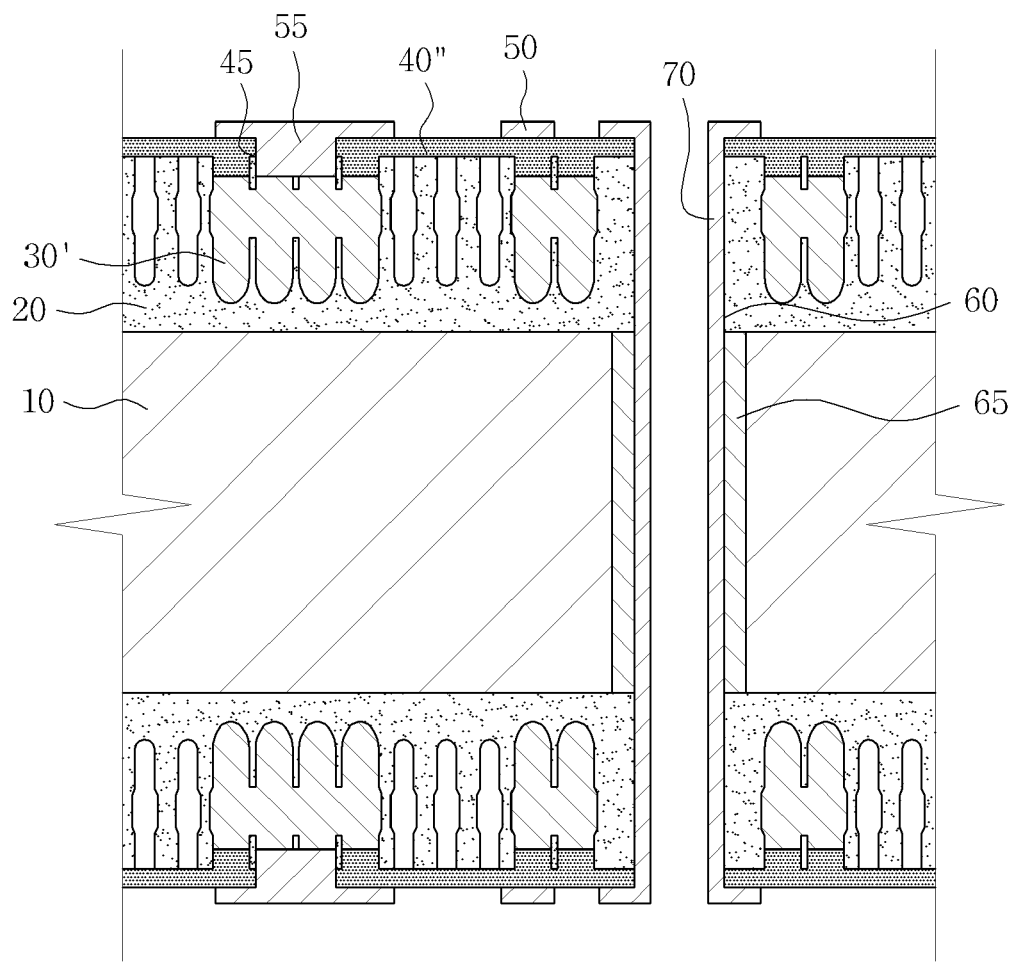
FIG. 8 is a cross-sectional view showing a modified embodiment of the heat-radiating substrate shown in FIG. 7.

FIG. 5 is a cross-sectional view showing a heat-radiating substrate according to a second preferred embodiment of the present invention, FIGS. 6 and 7 are cross-sectional views showing modified embodiments of the heat-radiating substrate shown in FIG. 5, and FIG. 8 is a cross-sectional view showing a modified embodiment of the heat-radiating substrate shown in FIG. 7.

A heat-radiating substrate according to this embodiment is described hereafter with reference to the figures. However, the detailed description for the same configuration as that of the heat-radiating substrate according to the first embodiment described with reference to FIGS. 1 to 4 is not provided.

As shown in FIG. 5, a heat-radiating substrate 200 according to this embodiment includes a metal core layer 10, a first porous insulating layer 20 formed on one or both sides of the metal core layer 10, a first circuit layer 30' embedded in the first insulating layer 20, and a second insulating layer 40'.

In this configuration, the first circuit layer 30' according to this embodiment is, unlike the first circuit layer 30 shown in FIG. 1, embedded in the first insulating layer 20, connected to the sides of second pores P2, and partially filled from the bottom of the second pores P2.

Further, the second insulating layer 40' is filled in the thickness direction from the upper end of the second pores P2 to make a plane having a flush surface with the first insulating layer 20.

To be more specific, the first circuit layer 30' is filled from the bottom along the sides in the second pore P2 included in the porous layer 24, but not completely filled in the second pores P2. However, as shown in FIG. 5, it is preferable that the first circuit layer 30' is formed slightly higher than the center from the bottom of the second pores P2 to be connected at the sides.

Further, the second insulating layer 40' is also filled in the second pores P2 from the upper surface to make a plane having a flush surface with the first insulating layer 20. In particular, when being filled to the upper ends of the crystalline pillars C adjacent to the second pores P2, it has the shape shown in FIG. 5.

Further, the second insulating layer 40' may be filled in the first pores P1, in addition to the second pores P2. Similarly, in this case, it is filled from the upper ends of the first pores P1 in the thickness direction and the second insulating layer 40' filled in the first pores is not limited in depth. In this configuration, since it is filled up to the bottom of the first pore P1, the insulating layer defining the outer surface of the heat-radiating substrate 200 is more firmly formed.

Meanwhile, when the second insulating layer 40' is filled in both the first pores P1 and the second pores P2, the multilayer heat-radiating substrate further including the second circuit layer and the first via can be achieved, as shown in FIG. 3.

FIG. 6 shows a modified embodiment of the heat-radiating substrate shown in FIG. 5. A heat-radiating substrate 200-1 according to this embodiment is characterized in that a second insulating layer 40" is filled in the pores of a porous layer 24, covering the upper surface of a first insulating layer 20. Therefore, a second insulating layer 40" may be filled in the second pores P2, extending to cover the upper surface of the first insulating layer 20, or the second insulating layer 40" may be filled in both the first pores P1 and the second pores P2, extending to cover the upper surface of the first insulating layer 20.

Accordingly, in the heat-radiating substrate 200-1, the second insulating layer 40" defines the outer surface of the heat-radiating substrate 200-1. In the heat-radiating substrate 200-1, the strength of the heat-radiating substrate is improved by minimizing the empty space of the pores P and the outer surface of the heat-radiating substrate becomes more flat.

Further, FIGS. 7 and 8 show a multilayer heat-radiating substrate and a double-sided heat-radiating substrate which are modified embodiments shown in FIG. 6.

A heat-radiating substrate 200-2 shown in FIG. 7 further includes a second circuit layer 50 formed on a second insulating layer 40" and a via 55 connecting a first circuit layer 30' with a second circuit layer 50. The structure and function of the second circuit layer 50 and the first via 55 are the same as those described with reference to FIG. 3 and the detailed description is not provided.

A heat-radiating substrate 200-3 shown in FIG. 8 further includes a second via 70 connecting second circuit layers 50 formed on both sides of a metal core layer 10. The structure and function of the second via 70 are also the same as those described with reference to FIG. 4, thus the detailed description is not provided.

FIGS. 9 to 14 are cross-sectional views schematically illustrating a manufacturing process of the heat-radiating substrate according to the first embodiment shown in FIG. 1 and a manufacturing process of a heat-radiating substrate according to this embodiment is described hereafter with reference to the figures.

Figure 9:
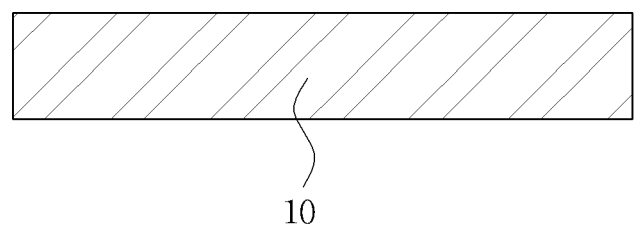
FIGS. 9 to 15 are cross-sectional views schematically illustrating a manufacturing process of the heat-radiating substrate according to the first embodiment shown in FIG. 1.

First, as shown in FIG. 9, a metal core member 10 for forming the metal core layer of the heat-radiating substrate is provided.

Figure 10:
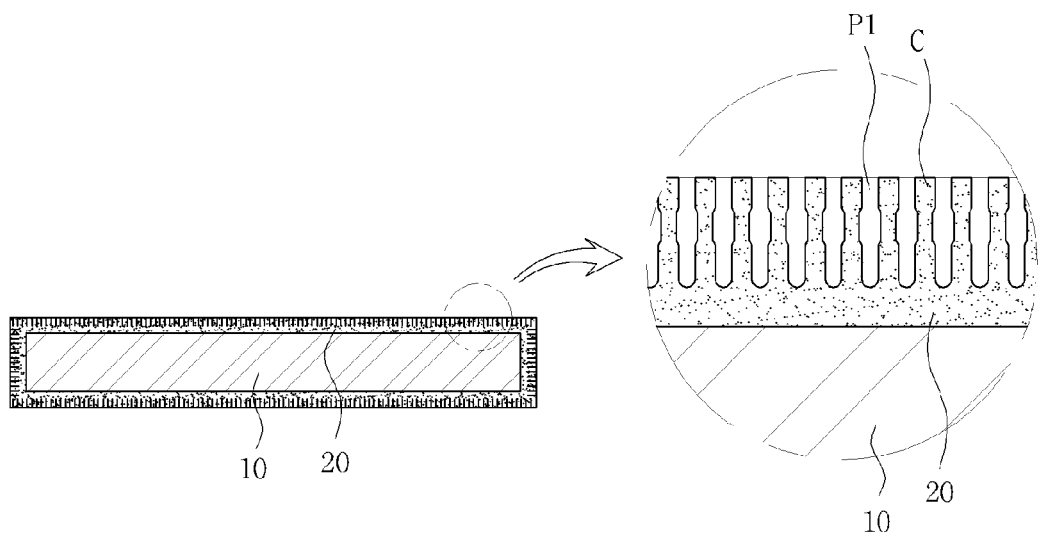

Next, one or both sides of the metal core member 10 are anodized, as shown in FIG. 10. Common anodization is a process of forming oxidized-insulating layer (metal oxidation layer) composed of a bather layer and a porous layer on the surface of the metal core member 10 by connecting the metal core member 10 with the anode of a direct current power source and immersing it into acid solution (electrolyte solution).

Although the first insulating layer 20 is formed of an oxidized-insulation layer in the present invention, as shown in FIG. 10, it is required to perform anodization three times under different conditions in order to form the porous layer 24 having the first pore P1 connected with the bather layer 22 and having a larger diameter at the center portion than both ends.

The process of anodization three times is described with reference to FIGS. 11A to 11C.

Figure 11A:
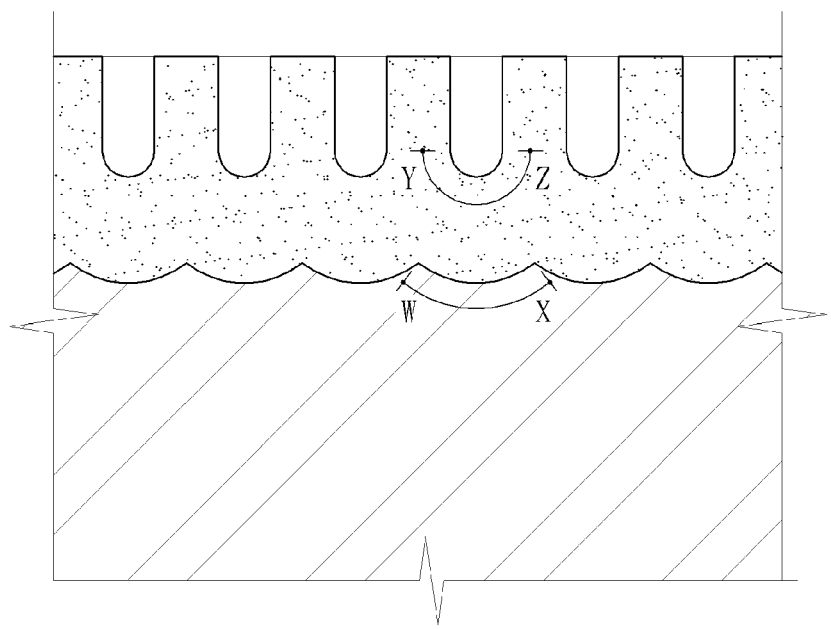

First, the oxidized-insulating layer shown in FIG. 11A is formed by first-anodizing the metal core member 10 shown in FIG. 9. The first anodization condition is to apply voltage of 137V to the metal core member 10 for 2 minutes in oxalic acid ($H_2C_2O_4$) electrolyte solution of 0.015 mol at 0.5 (This condition is referred to as an HA condition (Hard Anodization Condition)).

Exemplifying an aluminum member, as the surface of the aluminum member reacts with the electrolyte solution, the aluminum metal is oxidized into ions by the electrolyte solution at the interface (aluminum member/electrolyte solution), such that aluminum ions ($Al^{3+}$) are produced. Further, dots where current density is concentrated are formed on the surface of the aluminum member by the voltage applied to the aluminum member. Local heat is generated at the dots and the activity of the electrolyte solution (particularly, oxalic acid) increases, such that the aluminum rapidly reacts with the electrolyte solution and more aluminum ions are created. As a result, a plurality of micro grooves is formed in a predetermined arrangement on the surface of the aluminum member.

Further, as the water is decomposed by the applied voltage, the oxygen ions ($O^{2-}$) are moved to the grooves by the force of an electric field and react with the aluminum ions produced by the electrolyte solution, thereby forming an alumina layer.

The alumina layer formed by the anodization under the first anodization condition, as shown FIG. 11A, is composed of the bather layer and the porous layer having pores with small diameters.

Next, second anodization is performed after the first anodization is finished. The second anodization condition is to apply voltage of 110V for 15 minutes in phosphoric acid electrolyte solution of 4 wt % at 10 (this condition is referred to as an MA condition (Mild Anodization Condition)). As the second anodization is performed after the first anodization, as shown in FIG. 11B, a porous layer including pores having a diameter larger than the pores formed by the first anodization is formed.

The W'-X' interface of the barrier layer grows in the thickness direction, continuously forming alumina. Further, in the Y'-Z' interface, local heat is generated by electric concentration and alumina is more actively dissolved, and the Y'-Z' interface also grows in the thickness direction. Therefore, the depth of the pores further increases, with the thickness of the barrier layer maintained.

Figure 11B:
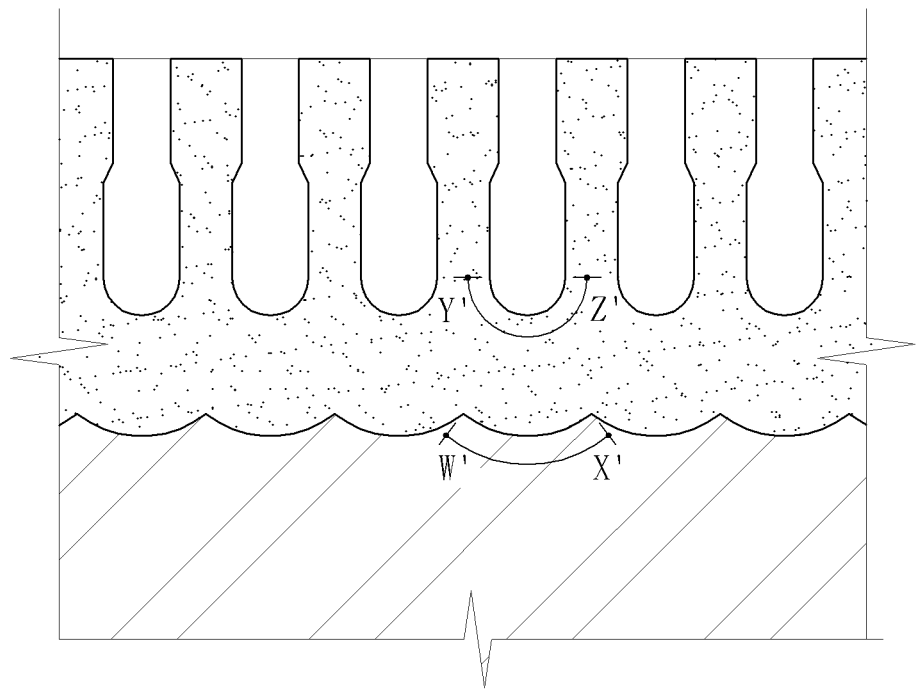
Figure 11C:
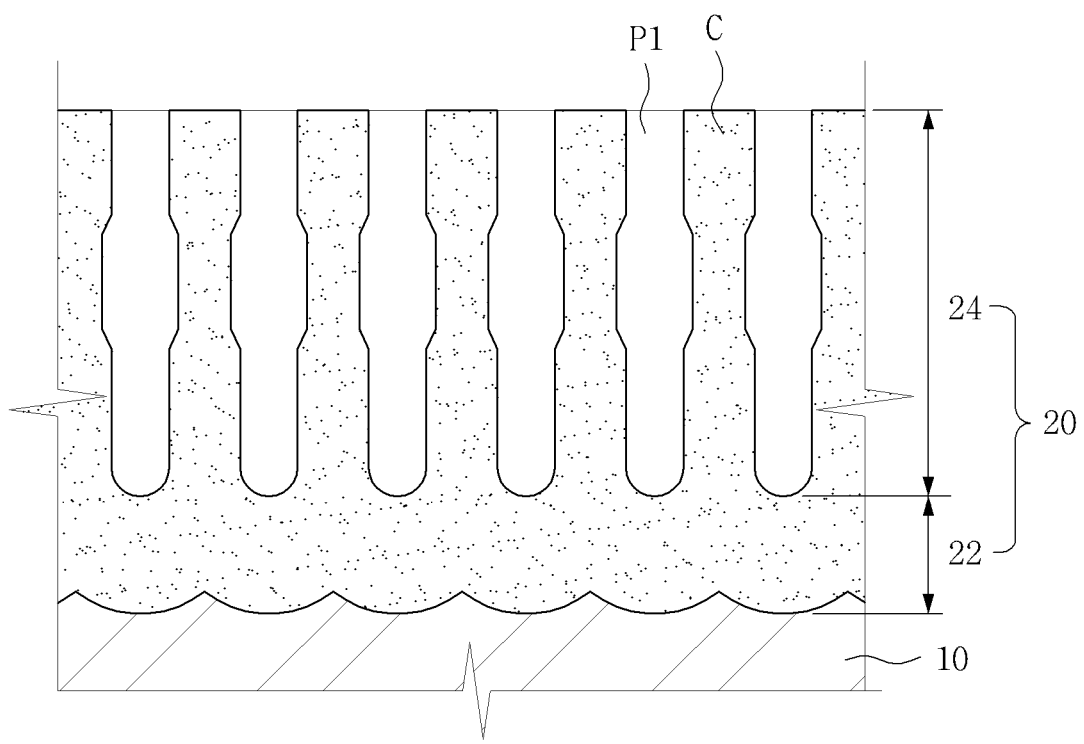

In this process, the alumina is more active at the Y'-Z' interface under the second anodization condition than the Y-Z interface under the first anodization condition, such that the pores formed in this process is larger in diameter than the pores formed the first anodization, as shown in FIG. 11B.

Thereafter, the first anodization is performed again, after the second anodization is finished. Accordingly, small-diameter pores are formed. The porous layer 24 having the first pores P1 shown in FIG. 11C is formed by performing the anodization three times, as described above.

Figure 12:
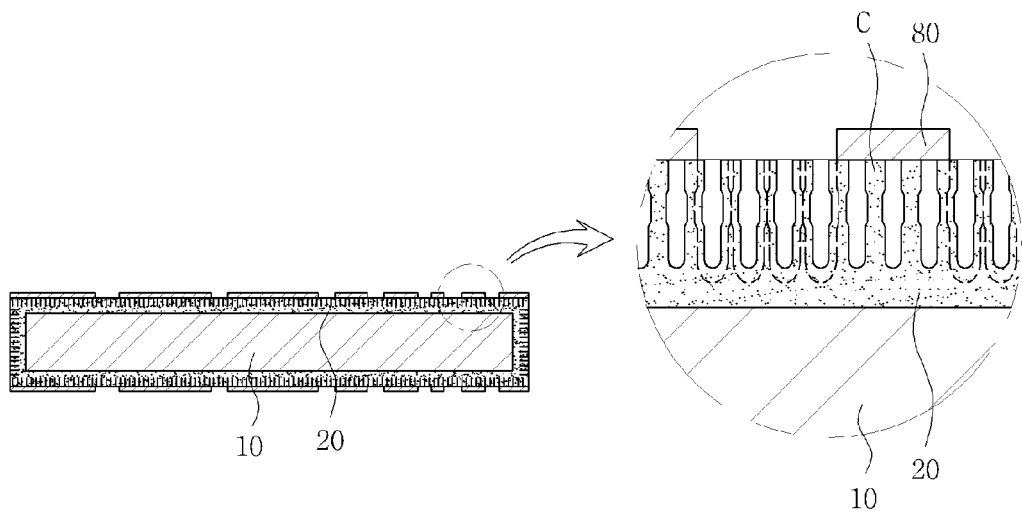

Thereafter, as shown in FIG. 12, isotropic-etching is performed such that the first pores P1 included in the porous layer 24 are connected with a plurality of adjacent pores, at the sides.

After the isotropic-etching is applied, the first pores P1 become the second pore P2, whereas the pores that are not etched by the etching-resist 80 still remains as the first pores P1. The type of etching solution used in this process is not limited.

The etching solution dissolves the inner walls of the first pores P1 to have a uniform thickness, in which the region (central region) of the first insulating layer 20 formed in the second anodization is entirely dissolved and connected with adjacent pore P1, because it's inner wall (crystalline pillar) is thinner than that of the region of the first insulating layer 20 formed in the first anodization. Accordingly, second pores P2 connected with a plurality of adjacent pores, at the sides, are formed.

Figure 13:
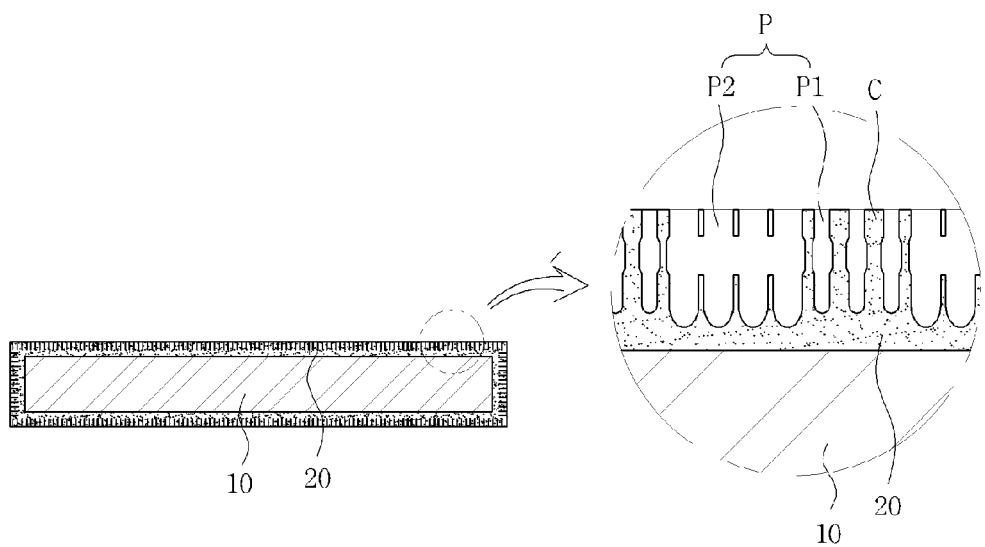

Next, the first insulating layer 20 including the porous layer 24 shown in FIG. 13 is formed by cleansing the heat-radiating substrate with acetone and deionized distilled water and removing the etching resist. The porous layer 24 has the first pores P1 shaped to have a larger diameter at the center portion than at both ends and the second pores P2 shaped to be connected with a plurality of adjacent pores, at the sides.

Figure 14:
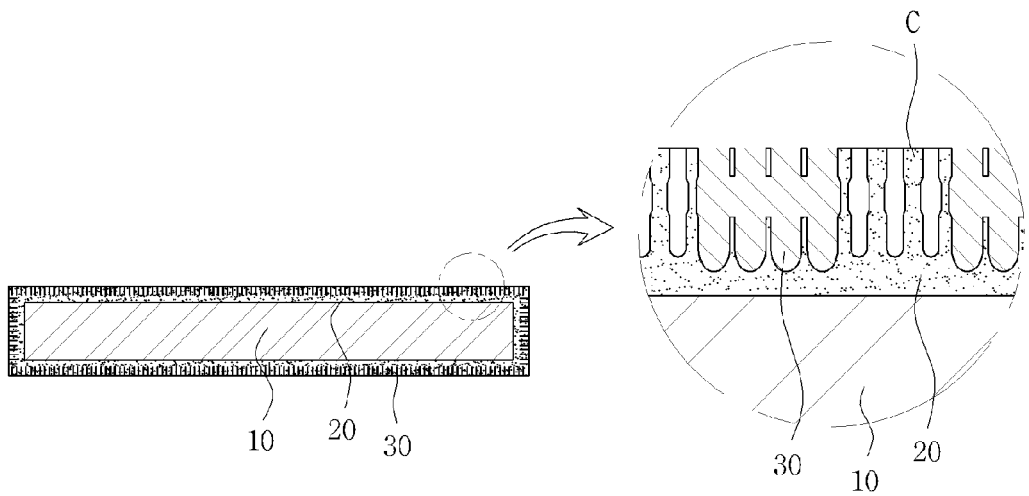

Next, as shown in FIG. 14, the first circuit layer 30 is formed to be embedded in the second pores P2. The first circuit layer 30 may be formed by plating. Meanwhile, the height of the first circuit layer 30 can be adjusted by plating conditions.

Dry film (or photoresist film) patterned by exposure and development processes is formed on the upper ends of the first pores P1 and the first circuit layer 30 is formed by electroless plating. Meanwhile, the first circuit layer 30 can be formed by a common SAP (Semi-Additive Process), an MSAP (Modified Semi-Additive Process), or a subtractive process.

Figure 15:
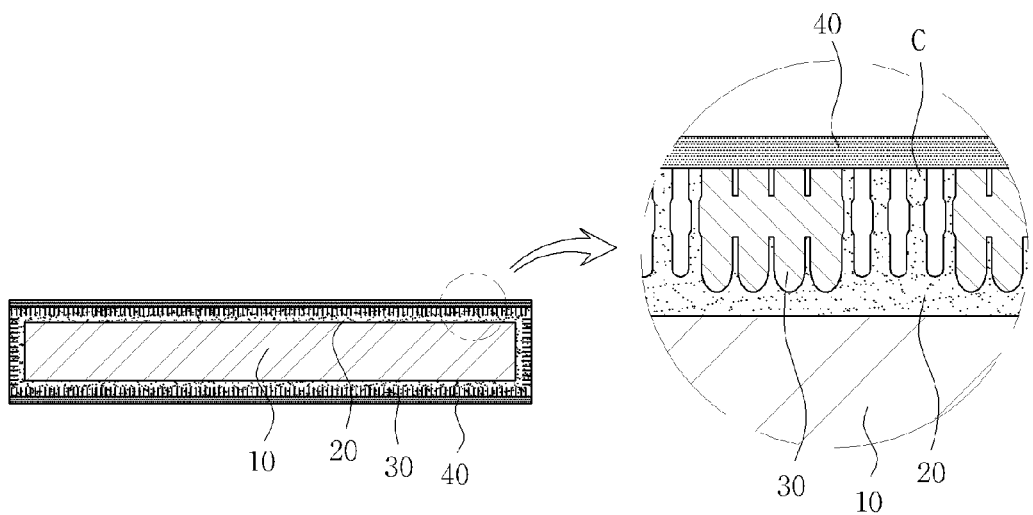

Next, as shown in FIG. 15, the second insulating layer 40 is sealed to cover the porous layer 24. As a result, the heat-radiating substrate shown in FIG. 1 is completed.

Figure 16:
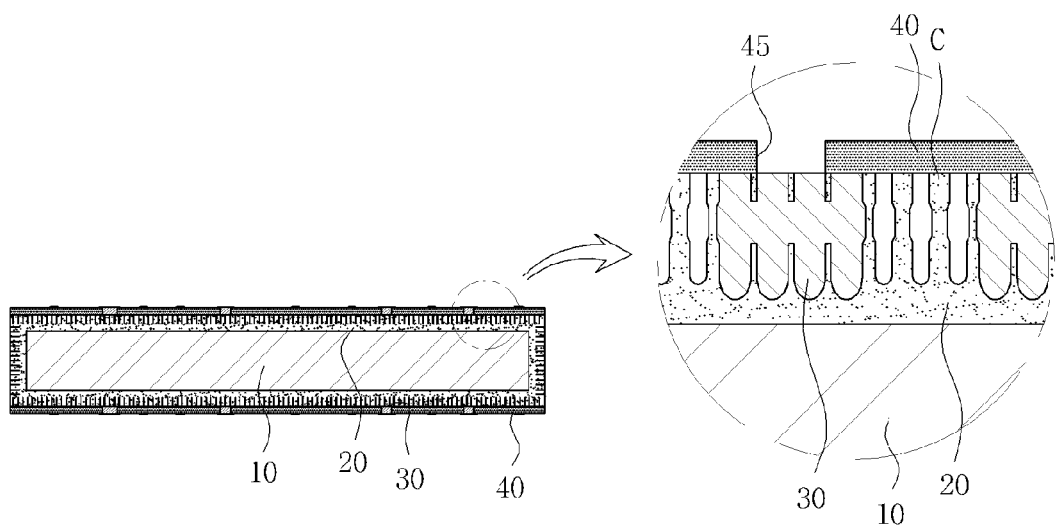
FIGS. 16 and 17 are cross-sectional views schematically illustrating a manufacturing process of the heat-radiating substrate shown in FIG. 3.
Figure 17:
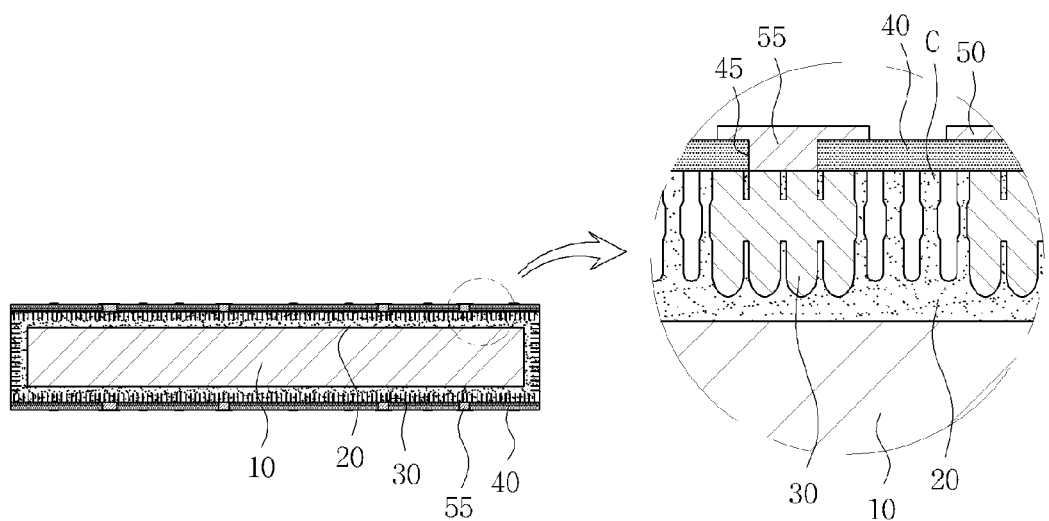

FIGS. 16 and 17 are cross-sectional views schematically illustrating a manufacturing process of the heat-radiating substrate shown in FIG. 3 and a manufacturing process of a heat-radiating substrate according to this embodiment is described hereafter with reference to the figures.

After sealing the first insulating layer 20 with the second insulating layer 40, as shown in FIG. 16, the first via-hole 45 is formed through the second insulating layer 40. The first via-hole 45 exposes the first circuit layer 30 and may be formed by a drill or a laser, such as an YAG laser or $CO_2$ laser.

Thereafter, as shown in FIG. 17, the second circuit layer 50 and the first via 55 are formed. The second circuit layer 50 and the first via 55 can be simultaneously formed by coating a plated layer and patterning (etching) it. For example, they may be formed by the SAP (Semi-Additive Process), MSAP (Modified Semi-Additive Process), or subtractive process.

On the other hand, though not shown in FIG. 17, a protective layer (not shown) may be additionally formed on the second circuit layer 50. The protective layer may be a solder resist and formed by common screen printing, roller coating, curtain coating, and spray coating.

Further, when the second circuit layer 50 includes a pad exposed to the outside, a pad protective layer may be formed by a finishing process performed by any one of electrolytic gold plate, electroless gold plate, electroless nickel/palladium/gold plating.

Figure 18:
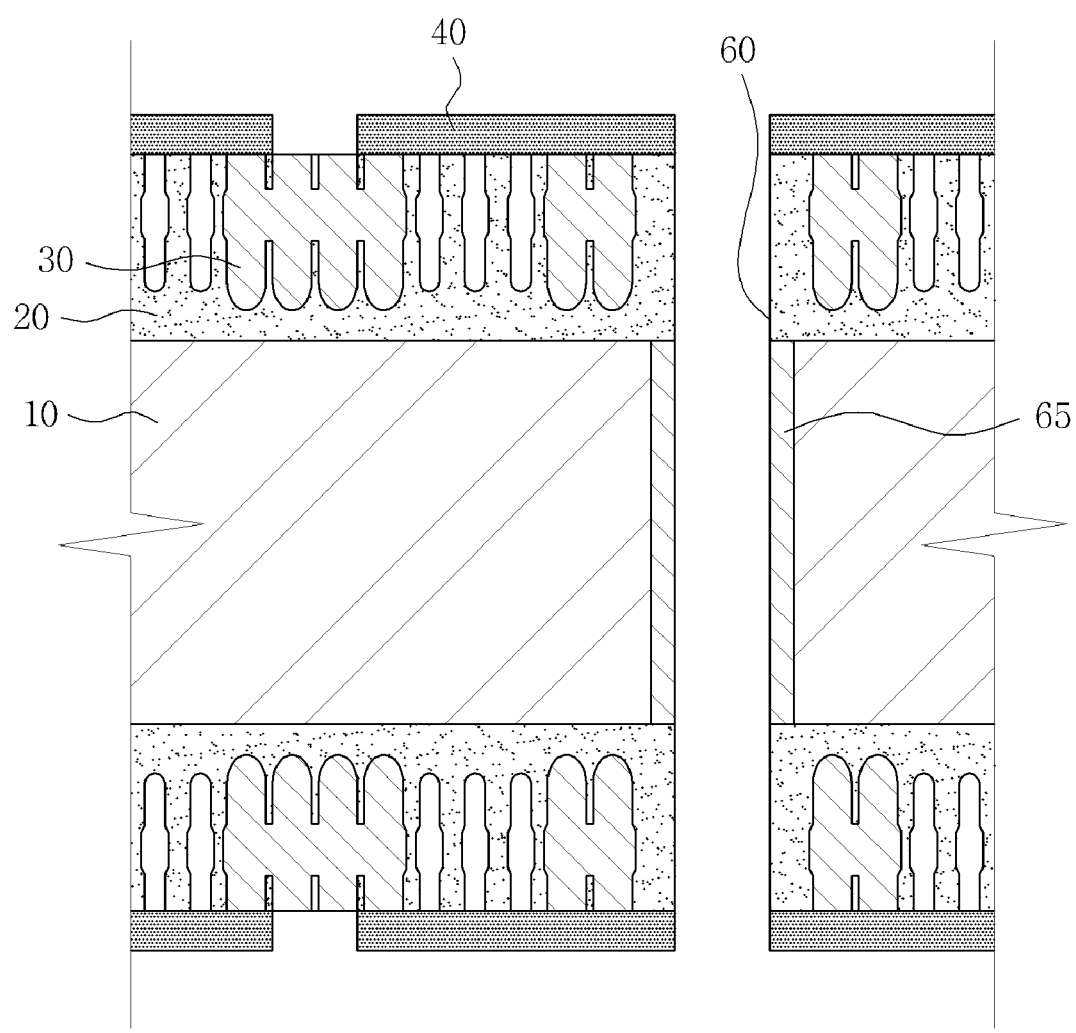
FIGS. 18 and 19 are cross-sectional views schematically illustrating a manufacturing process of the heat-radiating substrate shown in FIG. 4.
Figure 19:
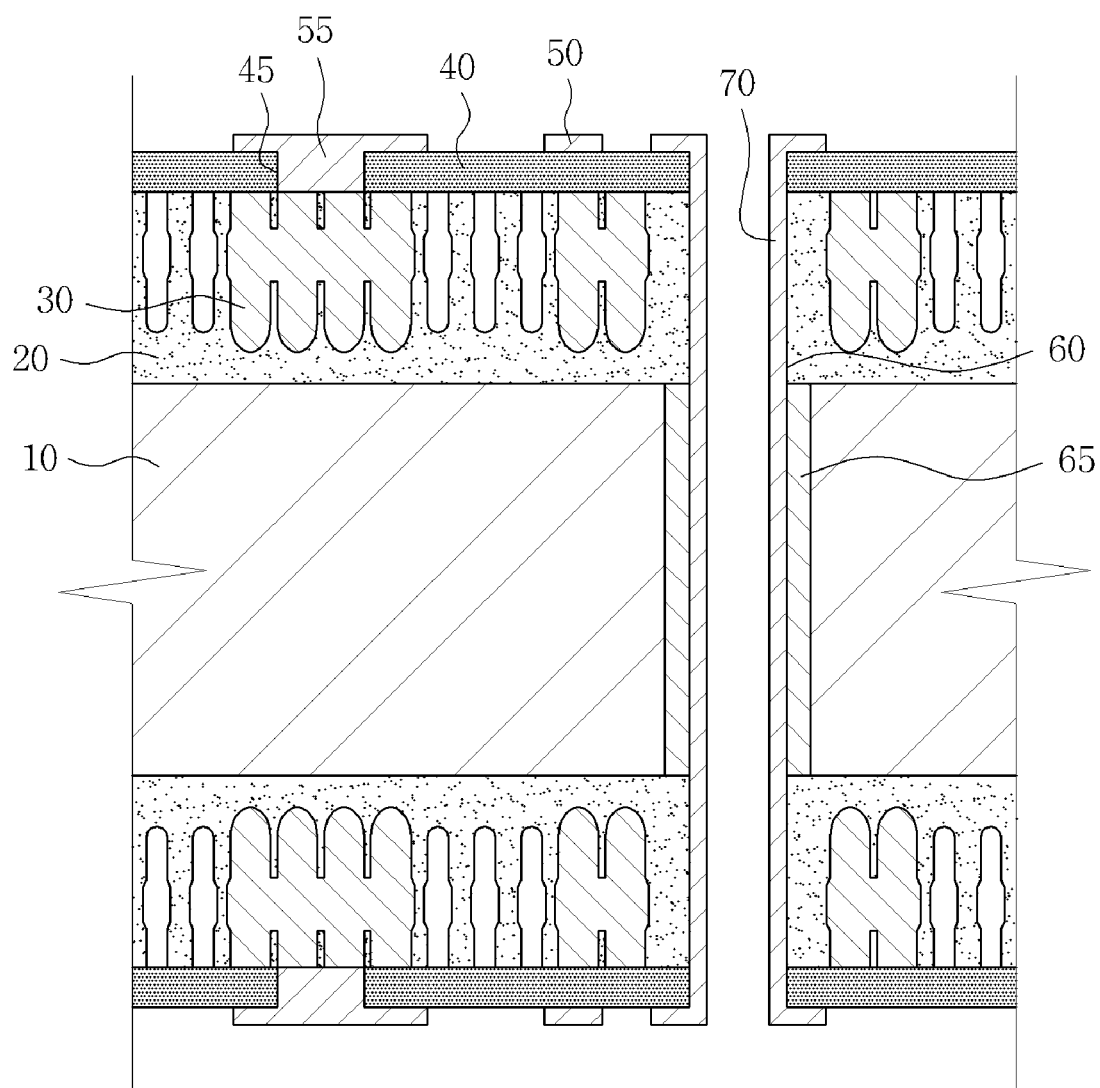

FIGS. 18 and 19 are cross-sectional views schematically illustrating a manufacturing process of the heat-radiating substrate shown in FIG. 4 and a manufacturing process of a heat-radiating substrate according to this embodiment is described hereafter with reference to the figures.

After the metal core member 10 is provided as shown in FIG. 9, the process is progressed to the step of sealing both sides of the metal core member 10 with the second insulating layer 40 shown in FIG. 15.

Thereafter, the first via-hole 45 is formed through the second insulating layer 40, as shown in FIG. 16, (where the first via-hole 45 is formed in one side or both sides of the heat-radiating substrate), and then as shown in FIG. 18, the second via-hole 60 is formed through the heat-radiating substrate 100-2.

Further, the inner insulating layer 65 is formed on the inner wall of the second via-hole 60. The inner insulating layer 65 may be formed by forming an inner oxidized-insulating layer (e.g. alumina inner layer) by oxidizing the portion passing through the metal core layer 10 or by applying a thin layer of insulating material throughout the inner wall of the second via-hole 60.

Further, as shown in FIG. 19, the first via 55, the second circuit layer 50, and the second via 70 are formed by plating.

They may also be formed by the SAP (Semi-Additive Process), MSAP (Modified Semi-Additive Process), or subtractive process.

The method of manufacturing the heat-radiating substrate 200 according to the second embodiment of the present invention shown in FIG. 5 is described in comparison with the method of manufacturing the heat-radiating substrate according to the first embodiment described with reference to FIGS. 9 to 14.

According to the heat-radiating substrate 200 shown in FIG. 5, in the forming of the first circuit layer 30 described with reference to FIG. 14, the first circuit layer 30' is embedded in the first insulating layer 20, connected to the sides of second pores P2, and partially filled from the bottom of the second pores P2.

Further, in the forming of the second insulating layer 40 described with reference to FIG. 15, the second insulating layer 40' is not sealed on the upper surface of the porous layer 24, but filled from the upper ends of the second pores P2 in the thickness direction to make a plane having a flush surface with the first insulating layer 20.

Further, according to the heat-radiating substrate 200-1 shown in FIG. 6, the second insulating layer 40" is filled in the pores P, extending to cover the upper surface of the porous layer 24, after the first circuit layer 30' is formed. Therefore, a second insulating layer 40' may be filled in the second pores P2, extending to cover the upper surface of the first insulating layer 20, or the second insulating layer 40" may be filled in both the first pores P1 and the second pores P2, extending to cover the upper surface of the first insulating layer 20.

Further, the heat-radiating substrates 200-2 and 200-3 shown in FIGS. 7 and 8 are formed through the process described with reference to FIGS. 16 to 19, after the heat-radiating substrate shown in FIG. 6 is formed.

A heat-radiating substrate according to the present invention includes not an insulating layer stacked on a metal core layer, but an oxidized-insulating layer and has improved heat-radiating performance by including a circuit layer embedded in the oxidized-insulating layer, thereby acquiring a micro circuit pattern.

Further, a multilayer heat-radiating substrate according to the present invention can be reduced in thickness and have improved heat-radiating characteristics, by including not a stacked insulating layer, such as a resin insulating layer, but porous oxidized-insulating layer formed by anodizing a metal core layer.

Further, the circuit layer of a heat-radiating substrate according to the present invention is formed in the porous oxidized-insulating layer and connected with the pores, at the sides, such that it is possible to prevent a short in the circuit pattern.

Further, a method of manufacturing a heat-radiating substrate according to the present invention simplifies the manufacturing process, increases productivity, and reduces manufacturing cost, without using a build-up process.

The present invention is not limited to the embodiment described herein and it should be understood that the present invention may be modified and changed in various ways without departing from the spirit and the scope of the present invention. Therefore, it should be appreciated that the modifications and changes are included in the claims of the present invention.

What is claimed is:

1. A heat-radiating substrate, comprising:
   a metal core layer;
   a first insulating layer that is formed on one side or both sides of the metal core layer, includes a barrier layer contacting with the metal core layer, first and second pores having different diameters, and a porous layer connected with the barrier layer;
   a first circuit layer that is embedded in the first insulating layer, filled in the second pores of the porous layer, and connected to the sides of the second pores; and
   a second insulating layer that is formed on the porous layer of the first insulating layer.

2. The heat-radiating substrate as set forth in claim 1, further comprising:
   a second circuit layer formed on the second insulating layer; and
   a first via connecting the first circuit layer with the second circuit layer.

3. The heat-radiating substrate as set forth in claim 2, further comprising a second via connecting the second circuit layers formed on both sides of the metal core layer.

4. The heat-radiating substrate as set forth in claim 1, wherein the metal core is made of aluminum and the first insulating layer is made of $Al_2O_3$.

5. A heat-radiating substrate, comprising:
   a metal core layer;
   a first insulating layer that is formed on one side or both sides of the metal core layer, includes a barrier layer contacting with the metal core layer, first and second pores having different diameters, and a porous layer connected with the barrier layer;
   a first circuit layer that is embedded in the first insulating layer, partially filled in the second pores of the porous layer from the bottom of the second pores, and connected to the sides of the second pores; and
   a second insulating layer that is filled from the upper ends of the second pore in the thickness direction to make a plane having a flush surface with the first insulating layer.

6. The heat-radiating substrate as set forth in claim 5, wherein the second insulating layer further includes:
   a second circuit layer formed on the flat surface made by the first insulating layer and the second insulating layer; and a first via that connects the first circuit layer with the second circuit layer.

7. The heat-radiating substrate as set forth in claim 5, where in the second insulating layer is filled in the first pores and the second pores of the porous layer, covering the upper surface of the porous layer of the first insulating layer.

8. The heat-radiating substrate as set forth in claim 7, further comprising:
   a second circuit layer formed on the second insulating layer; and
   a first via connecting the first circuit layer with the second circuit layer.

9. The heat-radiating substrate as set forth in claim 8, further comprising a second via connecting the second circuit layers formed on both sides of the metal core layer.

10. The heat-radiating substrate as set forth in claim 5, wherein the metal core is made of aluminum and the first insulating layer is made of $Al_2O_3$.

11. A method of manufacturing a heat-radiating substrate, comprising:
    providing a metal core member;
    forming a first insulating layer, which includes a barrier layer contacting with the metal core member and a porous layer including first pores connected with the barrier layer and having a larger diameter at the center portion than both ends, while anodizing one side or both sides of the metal core member;

performing isotropic-etching such that the first pores included in the porous layer becomes second pores connected with a plurality of adjacent pores, at the sides;

forming a first circuit layer that is embedded in the second pores; and sealing the porous layer with a second insulating layer.

12. The method of manufacturing a heat-radiating substrate as set forth in claim 11, further comprising:

forming a first via-hole to expose the first circuit layer; and forming a second circuit layer disposed on a first via connected with the first circuit layer and the second insulating layer, after the sealing with the second insulating layer.

13. The method of manufacturing a heat-radiating substrate as set forth in claim 12, further comprising:

forming a second via-hole through the heat-radiating substrate;

forming an inner insulating layer on the inner wall of the second via-hole; and forming the first via connected with the first circuit layer, the second circuit layer formed on the second insulating layer, and a second via connecting the second circuit layers disposed on both sides of the metal core member.

14. The method of manufacturing a heat-radiating substrate as set forth in claim 11, wherein the metal core member is made of aluminum and the first insulating layer is made of $Al_2O_3$.

15. A method of manufacturing a heat-radiating substrate, comprising: providing a metal core member;

forming a first insulating layer, which includes a barrier layer contacting with the metal core member and a porous layer including first pores connected with the barrier layer and having a larger diameter at the center portion than both ends, while anodizing one side or both sides of the metal core member;

performing isotropic-etching such that the first pores included in the porous layer becomes second pores connected with a plurality of adjacent pores, at the center portions; partially filling a first circuit layer from the bottom of the second pores in the second pores to be embedded in the second pore; and filling a second insulating layer from the upper ends of the second pores in the thickness direction to make a plane having a flush surface with the first insulating layer.

16. The method of manufacturing a heat-radiating substrate as set forth in claim 15, wherein, in the forming of the second insulating layer, the second insulating layer is filled in the first pores and the second pores of the porous layer to cover the upper surface of the first insulating layer.

17. The method of manufacturing a heat-radiating substrate as set forth in claim 16, further comprising:

forming a first via-hole to expose the first circuit layer; and forming a second circuit layer disposed on a first via connected with the first circuit layer and the second insulating layer, after the forming of the second insulating layer.

18. The method of manufacturing a heat-radiating substrate as set forth in claim 17, further comprising:

forming a second via-hole through the heat-radiating substrate;

forming an inner insulating layer on the inner wall of the second via-hole; and forming the first via connected with the first circuit layer, the second circuit layer disposed on the second insulating layer, and a second via connecting the second circuit layers disposed on both sides of the metal core member.

19. The method of manufacturing a heat-radiating substrate as set forth in claim 15, wherein the metal core member is made of aluminum and the first insulating layer is made of $Al_2O_3$.

* * * * *